United States Patent [19]

Arjavalingam et al.

[11] Patent Number: 5,258,236
[45] Date of Patent: Nov. 2, 1993

[54] MULTI-LAYER THIN FILM STRUCTURE AND PARALLEL PROCESSING METHOD FOR FABRICATING SAME

[75] Inventors: Gnanalingam Arjavalingam, Yorktown Heights; Alina Deutsch, Chappaqua; Fuad E. Doany, Katonah; Bruce K. Furman, Beacon; Donald J. Hunt, Pine Bush; Chandrasekhar Narayan, Hopewell Junction; Modest M. Oprysko, Mahopac; Sampath Purushothaman, Yorktown Heights; Vincent Ranieri, Tarrytown; Stephen Renick, Mahopac, all of N.Y.; Jane M. Shaw, Ridgefield, Conn.; Janusz S. Wilczynski, Ossining; David F. Witman, Pleasantville, both of N.Y.

[73] Assignee: IBM Corporation, Armonk, N.Y.

[21] Appl. No.: 695,368

[22] Filed: May 3, 1991

[51] Int. Cl.⁵ .................. B32B 15/04; H01L 29/12
[52] U.S. Cl. ................................. 428/626; 428/620; 428/623; 428/632

[58] Field of Search ............... 428/620, 623, 632, 626; 219/121.65, 121.68; 156/344, 643

[56] References Cited

U.S. PATENT DOCUMENTS

| | | | |
|---|---|---|---|
| 3,970,494 | 7/1976 | Pritchard | 156/344 |
| 4,664,739 | 5/1987 | Aurichio | 156/344 |
| 4,780,177 | 10/1988 | Wojnarowski et al. | 156/643 |
| 4,812,191 | 3/1989 | Ho et al | 156/344 |

Primary Examiner—Gary P. Straub
Assistant Examiner—Valerie Lund
Attorney, Agent, or Firm—Sughrue, Mion, Zinn, Macpeak & Seas

[57] ABSTRACT

A method and apparatus for releasing a workpiece from a substrate including providing a substrate which is transparent to a predetermined wavelength of electromagnetic radiation; forming, on the substrate, a separation layer which degrades in response to the predetermined radiation; providing the workpiece on the separation layer; and directing the predetermined radiation at the separation layer through the transparent substrate so as to degrade the separation layer and to separate the workpiece from the substrate.

7 Claims, 1 Drawing Sheet

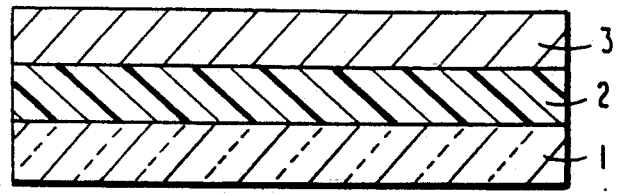
FIG.1
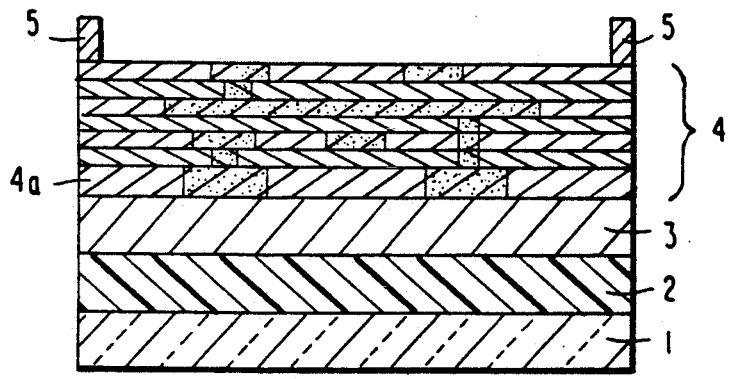
FIG.2
FIG.3
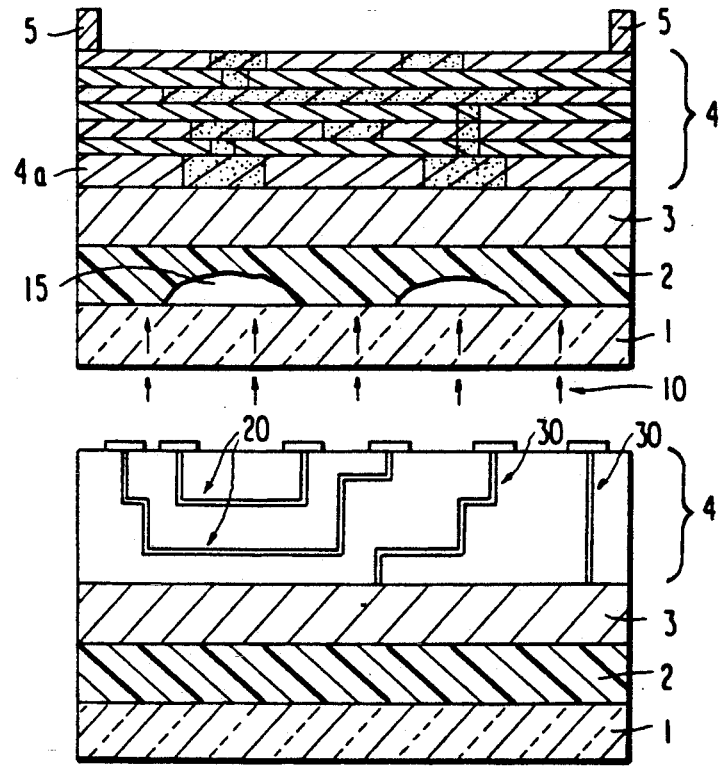
FIG.4
FIG.5
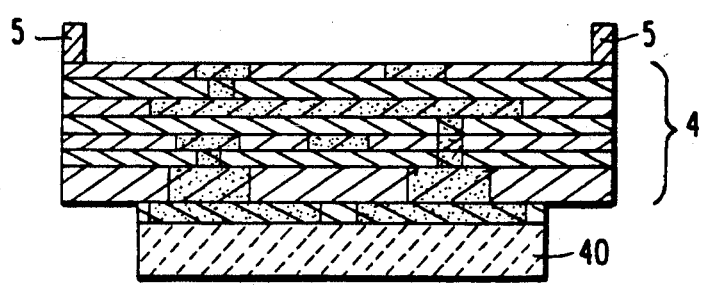

MULTI-LAYER THIN FILM STRUCTURE AND PARALLEL PROCESSING METHOD FOR FABRICATING SAME

FIELD OF THE INVENTION

The present invention relates to a multi-layer thin film structure, and a parallel processing method for fabricating same.

BACKGROUND OF THE INVENTION

In general, a multi-layer thin film interconnect structure is fabricated directly onto an electrically-good substrate, e.g., a ceramic or glass-ceramic substrate. Such a fabrication process has several drawbacks including WIP (Work In Progress) concerns because of the serial nature of the manufacturing sequence, and undesirable processing/handling of highly-valued glass-ceramic substrates. Further, if the fabricated multi-layer thin film structure is defective, then an otherwise electrically-good glass-ceramic substrate must be discarded or reworked.

Processing schemes have been proposed which allow for interconnect and other structures to be fabricated separately from the module on which they ultimately will be employed. The following are examples of such processing schemes.

U.S. Pat. No. 4,743,568 to Wood discloses a method in which an oxidation layer is formed on a silicon wafer. This is followed by the deposition of several metal and polyimide layers which are patterned to form a desired multilevel interconnect structure. This interconnect structure is subsequently separated from the silicon wafer by etching away the oxidation layer.

In U.S. Pat. No. 4,348,253 to Subbarao et al an adhesive layer is formed on a plating block, and a semiconductor wafer is provided on the adhesive layer. The adhesive layer is used for temporarily adhering the substrate wafer to the plating block. Specifically, after the semiconductor wafer is subjected to a plating process, the adhesive layer is dissolved in a solvent, and the plated semiconductor wafer is removed from the plating block.

U.S. Pat. No. 4,774,194 to Hokuyou discloses a process for manufacturing a solar cell structure. The process includes forming a "removable layer" on a semiconductor substrate, and fabricating the solar cell structure on the removable layer. The removable layer is then etched away to separate the fabricated solar cell structure from the semiconductor substrate.

U.S. Pat. No. 4,448,636 to Baber discloses a method in which a uniform metal film is applied over a patterned resist layer. A short pulse of radiant energy is then applied to the metal film, thereby causing the resist layer underneath the metal film to be locally heated. As a result, outgassing occurs which breaks the mechanical bond between the metal film and the patterned resist. The metal film can then be removed from the resist.

SUMMARY OF THE INVENTION

It is an object of the present invention to provide a parallel processing scheme which allows a multi-layer thin film interconnect structure and a ceramic substrate to be simultaneously fabricated.

It is another object of the invention to provide a multi-layer thin film structure which can be fully tested before being connected to a substrate.

It is still another object of the invention to provide a multi-layer thin film structure which can be easily handled.

These and other objects of the invention are accomplished by providing a substrate which is transparent to a predetermined wavelength of electromagnetic radiation; forming, on the substrate, a separation layer which degrades in response to the predetermined radiation but is stable through all thin film processing steps; providing a multi-layer interconnect thin film stack or other workpiece on the separation layer; and directing the predetermined radiation at the separation layer through the transparent substrate so as to degrade the separation layer and to separate the interconnect thin film stack or workpiece from the substrate.

BRIEF DESCRIPTION OF THE DRAWINGS

FIGS. 1–5 are enlarged cross-sectional views of various processing steps according to the invention.

PREFERRED EMODIMENT OF THE INVENTION

As shown in FIG. 1, initially, a transparent substrate or carrier 1 made from, for example, quartz is provided. The transparent substrate 1 has a diameter of, for example, about 82 mm, a thickness of, for example, about 3 mm and is polished on both surfaces thereof so as to be planar. Other diameters and thicknesses for the substrate 1 may be employed. As another example, the substrate 1 may be a 166 mm square substrate having a thickness of about 6 mm. A polymer layer 2 is then spun on the transparent substrate 1. The polymer layer 2 may be, for example, polyimide 5878 which is spun on transparent substrate 1 using A1100 as an adhesion layer to a thickness of between 5–15 μm. Polyimide 5878 and adhesive A1100 are well known in the art. Specifically, polyimide 5878 is commercially sold by DuPont under the product designation 5878 or PMDA-ODA, and adhesive A1100 is a well known adhesive promoter commercially sold by Ohio Valley Specialty Chemical. As will be described below, the polymer layer 2 serves as a "release layer" for releasing a multi-layer interconnect thin film structure, fabricated over polymer layer 2, from transparent substrate 1. It is important that polymer layer 2 be as planar as possible so as to minimize the stresses and strains on the fabricated interconnect structure during the release process. Such stresses and strain can cause damage to the interconnect structure.

After the polymer layer 2 has been planarized, a metal layer 3 having a thickness of between 10–1000 nm is deposited on polymer layer 2. The metal layer 3, may be for example, Cr, Mo, or Nb. Other metals can also be used with the only limitation being that the metal not dissolve in gold or copper, whichever is the metal of choice for the interconnect wiring.

The metal layer 3 serves a dual purpose. First, metal layer 3 serves as a reflecting layer for preventing radiation passing through transparent substrate 1 from reaching the multi-layer interconnect structure on the metal layer 3 during a laser ablation process. Second, metal layer 3 serves as an electrical ground plane for electrically testing of the multi-layer interconnect structure.

As shown in FIG. 2, a multi-layer interconnect structure 4 is fabricated on the metal layer 3. The interconnect structure 4 has a thickness of about 75 microns, and includes an initial layer 4a containing gold or copper contact studs which directly contact metal layer 3. The studs may be formed by plating through a photo mask.

The remaining layers of the interconnect structure 4 are then fabricated over the initial layer 4a using conventional wet and dry processes. A metal ring or frame 5 formed from, for example, aluminum or molybdenum, is then attached to the top surface of the fabricated interconnect structure 4. As shown in FIG. 2, the metal ring or frame 5 covers only the periphery of this top surface, and serves as a support for the multi-layer interconnect structure 4 after the interconnect structure 4 is released from transparent substrate 1 by a laser ablation technique which will now be described.

As shown in FIG. 3, ultraviolet light 10 from a scanning laser (not shown) is applied to the polymer layer 2 through the transparent substrate 1 in order to ablate the polymer layer 2. As discussed above, the metal layer 3 serves as a reflecting layer to prevent the ultraviolet light from reaching the interconnect structure 4.

Laser ablation of a polymer layer is known in the art, and is discussed in, for example, IBM Technical Disclosure Bulletin, Volume 28, No. 5, October 1985, by Donelon et al. As a result of the laser ablation, monomer fragments, i.e., ejected material gas, becomes trapped between the transparent substrate 1 and the reflecting metal layer 3, thereby forming voids 15 in the polymer layer 2, as shown in FIG. 3. These voids degrade the polymer layer 2, thereby allowing transparent substrate 1 to be separated or released from the rest of the structure.

For the laser ablation technique discussed above, two different lasers were successfully used. The first was a KrF laser operating at 248 nm. With this laser, single pulses with energies between 100 mJ/cm$^2$ and 120 mJ/cm$^2$ worked well. The second laser used was a XeCl laser operating at 308 nm. With this laser, a single pulse with an energy of about 100 mJ/cm$^2$ was effective. For both lasers, the transparent substrate 1 could not be released through the polymer layer 2 if the energies used were below 40 mJ/cm$^2$. In fact, with the KrF laser even a 100 Hz beam at 10 mJ/cm$^2$ did not work indicating that heat was not the mechanism causing release. Specifically, the 100 Hz beam applies the same heat into the polymer layer 2 in 100 msec as does the single 100 mJ energy pulse which worked well. This data is consistent with polymer ablation data which indicates that the beam energy should exceed about 50 mJ/cm$^2$ in order for ablation to occur.

After the interconnect structure 4 has been released from the substrate 1, it is supported by the metal ring/frame 5. At this point, the structure 4 can be applied to an electrically-good glass-ceramic substrate. However, the interconnect structure is first tested. As will now be described, most of this testing can be conducted while the interconnect structure 4 is still connected to the transparent substrate, whereas some of the testing must be conducted after the interconnect structure 4 has been separated from the transparent substrate 1.

As shown in FIG. 4, there are two different types of conducting paths in a multi-layer interconnect structure. The first type, indicated by the reference numeral 20, is repair-related wiring or inter-chip wiring which starts and terminates on the top surface of the multi-layer interconnect structure 4. The second type of conducting path, indicated by the reference numeral 30, is power vias or interchip wiring which goes through the interconnect structure 4.

The first type of conducting path 20 can be completely tested for both shorts and opens from the top surface of the interconnect structure 4 while structure 4 is connected to the transparent substrate 1 through metal layer 3 and polymer layer 2.

However, during the time that interconnect structure 4 is connected to substrate 1, the second type of conducting path 30 can only be tested by making contact to the metal layer 3. As such, only testing for opens can be conducted. Once the interconnect structure 4 is released from substrate 1 and supported by metal ring or frame 5, the metal layer 3 is etched revealing the gold or copper studs in initial layer 4a. Once the studs are revealed, conducting path 30 can be tested for shorts.

After a successful test of the multilayer interconnect structure 4, the structure can be joined to an electrically-good glass-ceramic substrate. FIG. 5 shows the completed product, i.e., interconnect structure 4 joined to an electrically-good glass-ceramic substrate 40, before the metal ring/frame 5 has been removed.

A number of known polymer/polymer and polymer/metal adhesion techniques can be used to achieve complete contact between the multi-layer interconnect structure 4 and the substrate 40. For example, the interconnect structure 4 can be bonded to substrate 40 using Au-Au thermo-compression bonding at 375° C. under pressure of 300 psi.

A processing scheme has been described wherein a multi-layer interconnect structure is fabricated and tested separately from the glass-ceramic substrate. This approach can greatly enhance the yield of the completed module since the interconnect structure can be tested before being joined to the glass-ceramic substrate. In addition, since the multi-layer interconnect structure and the glass-ceramic substrate are manufactured independently of each other, the WIP concerns are minimal. As an added advantage, the glass-ceramic substrate is not subjected to any thin film processing steps which may be as many as several hundreds.

It will be apparent to those skilled in the art that modifications and variations may be introduced in practicing the present invention. For example, instead of using the metal layer 3, the polymer layer 2 may be doped with a dopant which absorbs laser energy. In this embodiment of the invention, since most of the laser energy will be absorbed within the doped layer, there is no need for the reflecting metal layer 3. However, when using the doped polymer layer described above instead of the polymer and metal layers 2 and 3, respectively, testing of the second type of wiring 30 cannot be achieved. Testing is however possible by placing the workpiece, after release, on a conducting table and measuring for opens. In fact, if the release layer 2 is thicker than 5μm, no layer 3 is necessary because the release damage is limited to less than 1μm.

What is claimed is:

1. A structure for receiving electromagnetic radiation having a wavelength and an energy, the structure comprising:
   a substrate which is transparent to the wavelength of the electromagnetic radiation;
   a separation layer disposed on said substrate, said separation layer degrading in response to the energy of the electromagnetic radiation; and
   a multi-layer interconnect thin film stack disposed on said separation layer.

2. The structure as defined in claim 1, wherein said separation layer is a polymer.

3. The structure as defined in claim 2, wherein said polymer is polyimide.

4. The structure as defined in claim 1, further comprising a reflecting layer disposed between said separation layer and said stack, said reflecting layer reflecting said radiation.

5. The structure as defined in claim 4, wherein said reflecting layer is a metal layer.

6. A structure for receiving electromagnetic radiation having a wavelength and an energy, the structure comprising:
- a substrate which is transparent to the wavelength of the electromagnetic radiation;
- a separation layer disposed on said substrate, said separation layer degrading in response to the energy of the electromagnetic radiation;
- a multi-layer interconnect thin film stack disposed on said separation layer;
- a metal reflecting layer disposed between said separation layer and said stack, said reflecting layer reflecting said radiation; and
- a ring attached to a top surface of said stack.

7. The structure as defined in claim 6, wherein said ring is metal.

* * * * *